(12) United States Patent
Metzger et al.

(10) Patent No.: US 7,301,182 B1
(45) Date of Patent: Nov. 27, 2007

(54) CIRCUIT LAYOUT FOR IMPROVED PERFORMANCE WHILE PRESERVING OR IMPROVING DENSITY

(75) Inventors: Larry Metzger, Austin, TX (US); Kerry Ilgenstein, Austin, TX (US); Sunil Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 231 days.

(21) Appl. No.: 11/226,695

(22) Filed: Sep. 13, 2005

(51) Int. Cl.
*H01L 27/10* (2006.01)

(52) U.S. Cl. ..................... 257/202; 257/206

(58) Field of Classification Search ......... 257/202–206
See application file for complete search history.

(56) References Cited

U.S. PATENT DOCUMENTS 5,874,754 A * 2/1999 Lee et al. ................... 257/206

* cited by examiner

*Primary Examiner*—Cuong Nguyen

(57) ABSTRACT

In one embodiment, a circuit may be formed by forming at least one bent-gate output stage transistor and at least one bent-gate input stage transistor. The bent-gate output stage transistor may be electrically isolated from an input to the bent-gate input stage transistor by forming at least one bent-gate grounded-gate transistor between the bent-gate output stage transistor and the input to the bent-gate input stage transistor.

14 Claims, 4 Drawing Sheets

CIRCUIT LAYOUT FOR IMPROVED PERFORMANCE WHILE PRESERVING OR IMPROVING DENSITY

TECHNICAL FIELD

The present disclosure relates to circuits employing bent-gate transistors.

BACKGROUND

Field programmable gate arrays (FPGAs) may employ programmable logic cells (PLCs) that may be configured into application-specific circuits. PLCs may employ circuits such as multiplexers fashioned from bent-gate type transistors, often NMOS type transistors. Bent-gate style transistors may provide for more compact designs. However, circuits employing bent-gate transistors may suffer degraded performance due to conductivity restrictions in the narrow active regions (source and/or drain regions of the transistor where carriers are active) of bent-gate designs.

SUMMARY

In one embodiment, a first circuit may be formed by forming at least one bent-gate output stage transistor and at least one bent-gate input stage transistor. An output stage transistor may be electrically isolated from an input to the bent-gate input stage transistor by forming at least one bent-gate grounded-gate transistor between the bent-gate output stage transistor and the input to the bent-gate input stage transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Prior Art PLC Multiplexer

Figure 1:
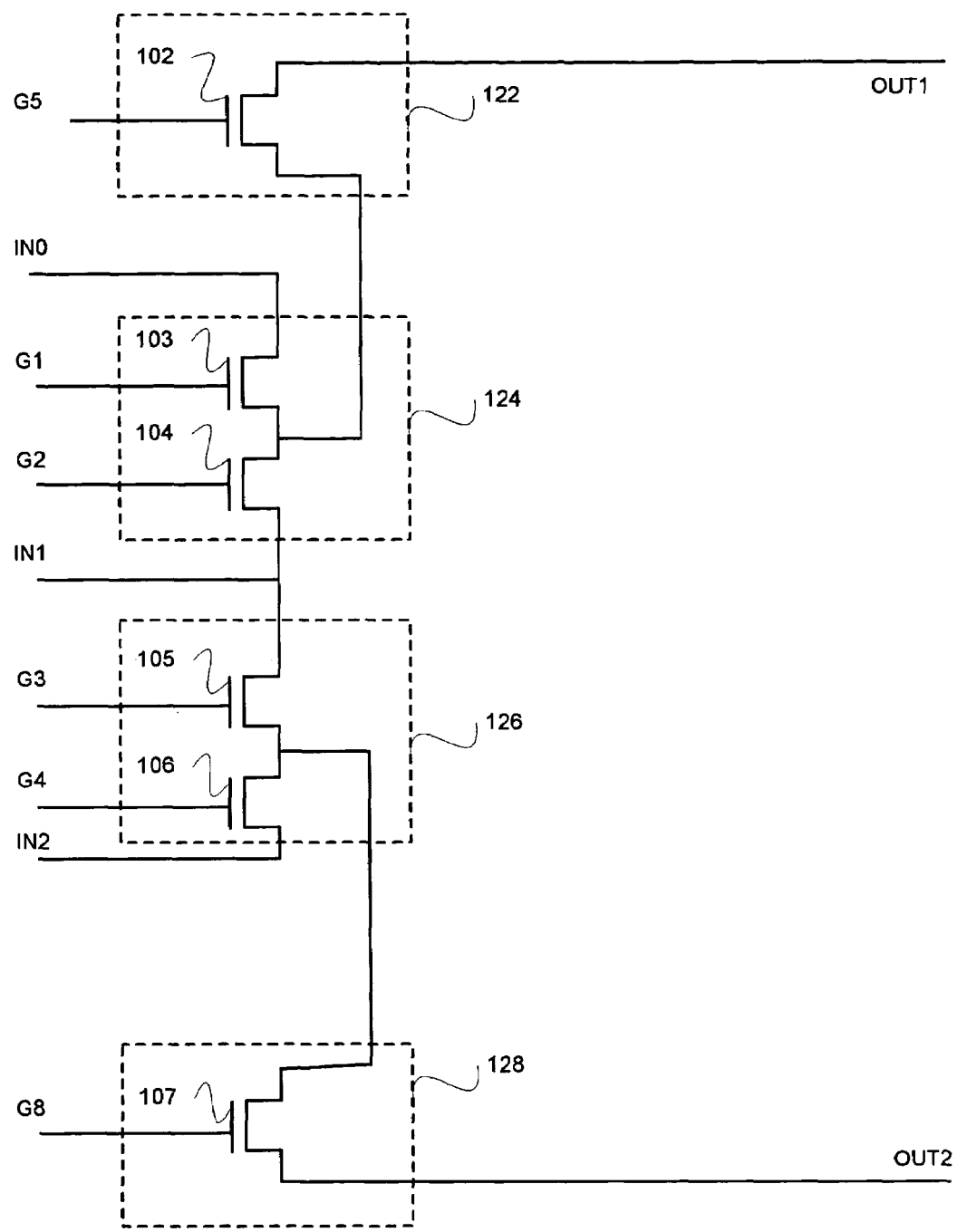
FIG. 1 is a circuit schematic of a prior art PLC multiplexer.

FIG. 1 is a circuit schematic of a prior art PLC multiplexer. The PLC multiplexer, part of a programmable logic cell, comprises a first multiplexer having an input stage 124 and an output stage 122. The output stage 122 comprises a transistor 102 that, when turned on, passes a signal received from the input stage 124 to the output OUT1. The input stage 124 comprises two transistors 103 104. Depending upon which of the transistors 103 104 is turned on by gate signals G1 and G2, either mux input IN0 or IN1 is provided to the input of the output stage 122.

The PLC multiplexer further comprises a second multiplexer having an input stage 126 and an output stage 128. The output stage 128 comprises a transistor 107 that, when turned on, passes a signal received from the input stage 126 to the output OUT2. The input stage 126 comprises two transistors 105 106. Depending upon which of the transistors 105 106 is turned on by gate signals G3 and G4, either multiplexer input IN1 or IN2 is provided to the input of the output stage 128.

Those skilled in the art will appreciate that the PLC multiplexer may contain other components as well, such as other transistors, which have not been shown and which are not essential to this description.

Layout of the Prior Art PLC Multiplexer of FIG. 1

Figure 2:
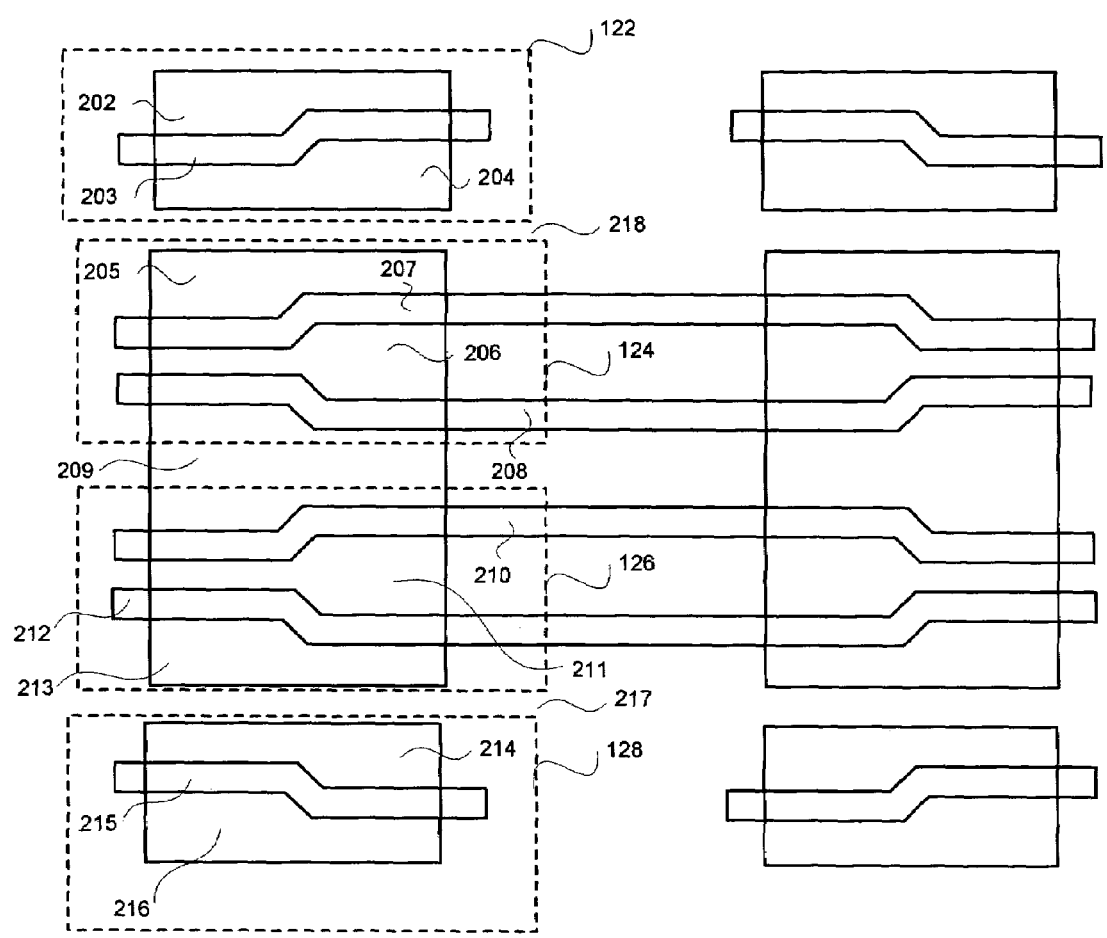
FIG. 2 is an illustration of a layout of the prior art PLC multiplexer of FIG. 1.

FIG. 2 is an illustration of a layout of the prior art PLC multiplexer of FIG. 1. The output stages 122 128 are electrically isolated from the input stages 124 126 by shallow trench isolation regions 218 217, respectively.

The transistor 102 of the output stage 122 comprises a first active region 202 (e.g. drain) coupled to OUT1, a bent-gate layer 203, and a second active region 204 coupled to receive an input from the input stage 124. The coupling between the active region 204 and the input stage 124 is not shown in FIG. 2 to clarify the illustration.

Herein, the term "active region" refers to a semiconductor region through which passes a current representing an input to or output from the circuit. Gate regions are not herein considered active regions.

The active regions 205 209 of the input stage 124 receive multiplexer inputs IN0 and IN1, respectively. Signals to bent gates 207 208 select the multiplexer inputs IN0 IN1 to active region 206, which is coupled to active region 204 of the output stage 122. The coupling between the active regions 206 204 is not shown in FIG. 2 to clarify the illustration.

The transistor 107 of the output stage 128 comprises a first active region 216 (e.g. drain) coupled to OUT2, a bent-gate layer 215, and a second active region 214 coupled to receive an input from the input stage 126. The coupling of active region 214 and the input stage 126 is not shown in FIG. 2 to clarify the illustration.

The active regions 209 213 of the input stage 126 receive multiplexer inputs IN1 and IN2, respectively. Signals to bent gates 210 212 select the multiplexer inputs IN1 IN2 to active region 211, which is coupled to active region 214 of the output stage 128. The coupling between active regions 211 214 is not shown in FIG. 2 to clarify the illustration.

The use of bent gate transistors results in a more compact layout; however, as can be seen the active regions 204, 205, 213, and 214 are somewhat narrow due to the bent gate design. Performance degradation may result due to conductivity restrictions in these narrow active regions.

PLC Multiplexer Employing Grounded-Gate Isolation Transistors

Figure 3:
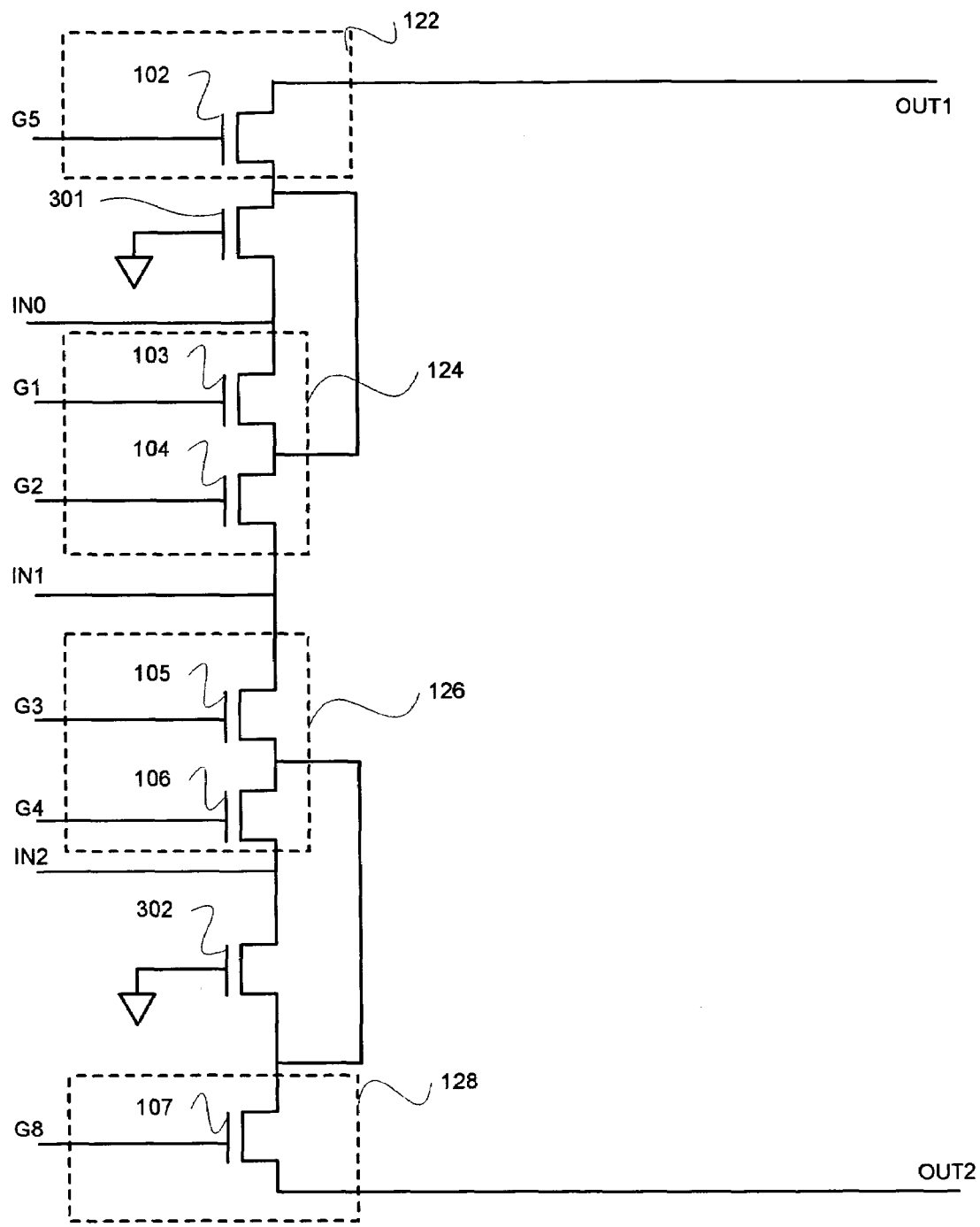
FIG. 3 is a circuit schematic of an embodiment of a PLC multiplexer employing grounded-gate isolation transistors.

FIG. 3 is a circuit schematic of an embodiment of a PLC multiplexer employing grounded-gate isolation transistors.

The PLC multiplexer, part of a programmable logic cell, comprises a first multiplexer having an input stage 124 and an output stage 122. The output stage 122 is electrically isolated from the input IN0 by a grounded gate transistor 301.

The PLC multiplexer further comprises a second multiplexer having an input stage 126 and an output stage 128. The output stage 128 is electrically isolated from the input IN2 by a grounded gate transistor 302.

The multiplexer circuit embodiment illustrated has two input stages each including a pair of bent-gate transistors; however, other embodiments may include additional input stages, output stages, and various numbers of transistors for the input and output stages.

Figure 4:
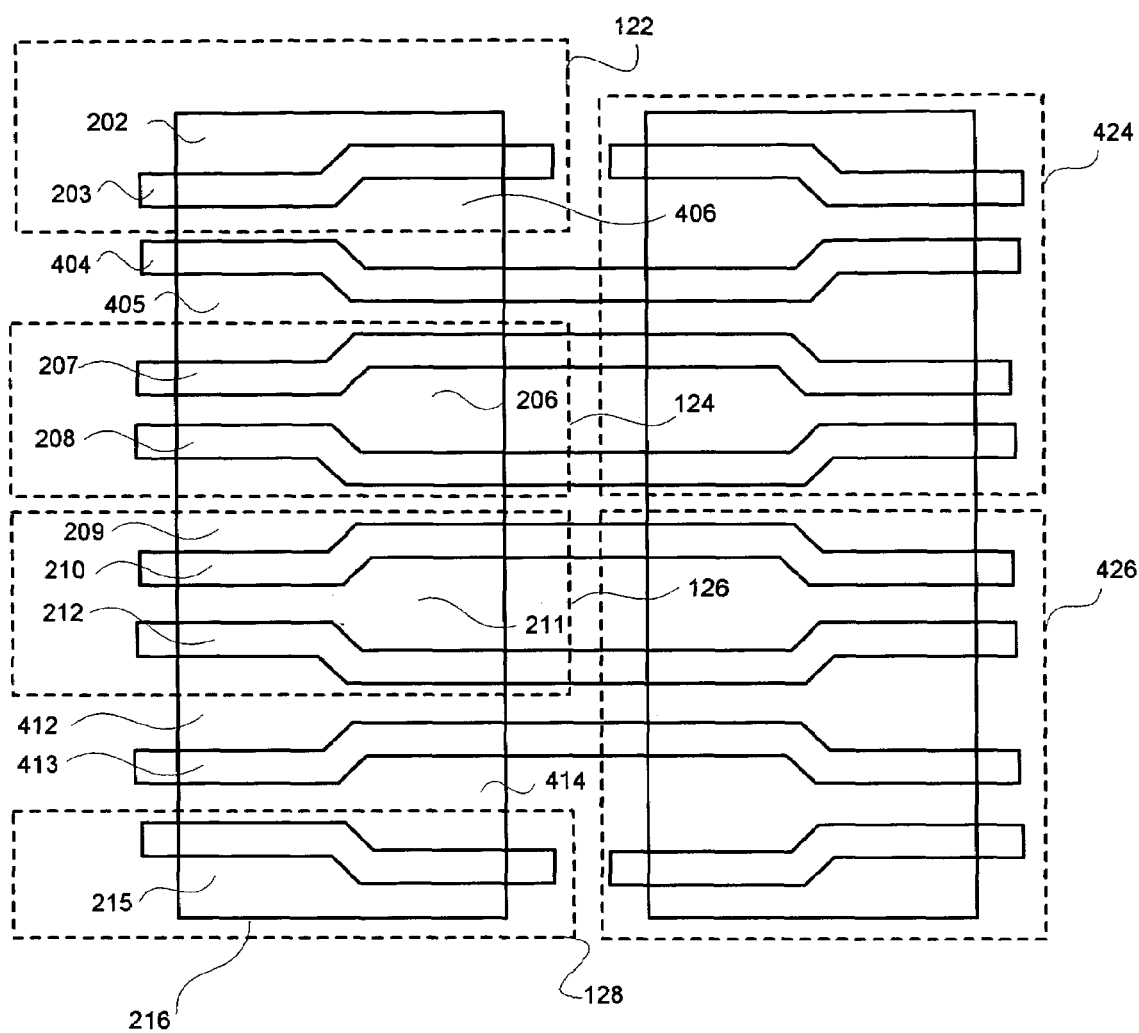
FIG. 4 is an illustration of an embodiment of a layout of a PLC multiplexer employing isolation transistors.

An input stage 124 of the first multiplexer may be coupled to an input stage 126 of the second multiplexer. The PLC may further comprise a third multiplexer and a fourth multiplexer sharing gate drives with input stages of the first and second multiplexers, as shown in the layout of FIG. 4.

Those skilled in the art will appreciate that the PLC multiplexer may contain other components as well, such as other transistors, which have not been shown and which are not essential to this description.

Grounded bent-gate transistors may be employed to electrically isolate cell input stages from cell output stages. More specifically, the bent-gate output stage transistor 102, where the output stage 122 receives the multiplexer input from the input stage 124, may be electrically isolated by grounded-gate transistor 301 (also bent-gate) from the input IN0 to bent-gate input stage transistor 103 of the input stage 124. Also, the bent-gate output stage transistor 107, where the output stage 128 receives the multiplexer input from the input stage 126, is electrically isolated by grounded-gate transistor 302 (also bent-gate) from the input IN2 to bent-gate input stage transistor 106 of the input stage 126.

Layout of a PLC Multiplexer Employing Isolation Transistors

FIG. 4 is an illustration of an embodiment of a layout of a PLC multiplexer employing isolation transistors.

Active regions of the bent-gate output stage transistor 102 and the bent-gate grounded-gate isolation transistor 301 may be combined to form an at least partially widened first active region 406. The shallow trench isolation 218 between the input stage 124 and output stage 122 is eliminated.

Active regions of the bent-gate input stage transistor 103 and the grounded-gate isolation transistor 301 may be combined to form an at least partially widened second active region 405. The grounded gate 404 of the isolation transistor 301 provides electrical isolation between the output stage 122 and an input IN0 to the input stage 124.

The grounded bent-gate transistor 301 thus serves to at least partially widen the active region 406 shared with transistor 102 of the PLC output stage 122 where the cell output stage 122 receives an input from the cell input stage 124.

At least one grounded-gate transistor may be coupled to at least partially widen an active region where the multiplexer receives the multiplexer input. Such coupling may also serve to at least partially widen an active region where the output stage receives the multiplexer input. Conductivity may be improved in the widened regions, thus improving performance. The grounded-gate transistor may replace a shallow trench isolation region, so that the improvement in performance may be achieved without substantial increase in layout size.

In some embodiments, such as the embodiment illustrated in FIG. 4, grounded-gate transistor(s) may be coupled to create an at least partially widened active regions where output stages are coupled to active regions (e.g. 209) shared by two or more transistors of the PLC multiplexer input stage (e.g. PLC input stages 124 and 126).

Active regions of the bent-gate output stage transistor 107 and the bent-gate grounded-gate isolation transistor 302 may be combined to form an at least partially widened first active region 414. The shallow trench isolation 217 between the input stage 126 and output stage 128 is eliminated.

Active regions of the bent-gate input stage transistor 106 and the grounded-gate isolation transistor 302 may be combined to form an at least partially widened second active region 412. The grounded gate 413 of the isolation transistor 302 provides electrical isolation between an input IN2 to the input stage 126 and the output stage 128.

The grounded bent-gate transistor 302 thus forms an at least partially widened active region 414 with a transistor 107 of the PLC output stage 128 where the cell output stage 122 receives an input from the cell input stage 126.

Active regions of at least one bent-gate input stage transistor 105 of the second multiplexer circuit and the at least one bent-gate input stage transistor 104 of the first multiplexer circuit may be combined to form a combined active region 209. An at least partially widened active region 209 is thus formed between the bent-gate transistors 104 105 of the input stages 124 126.

The programmable logic cell may include and/or involve the third multiplexer 424 and a fourth multiplexer 426 each having bent-gate transistors joined to form an at least partially widened active region between the bent-gate transistors, as shown in FIG. 4.

Those having skill in the art will appreciate that the invention is not limited to multiplexers, and that various alternative arrangements of the circuits described herein may nonetheless fall within the contemplated scope of the invention. For example, the circuit outputs may be coupled to drains of the output stage transistors, with the output stages transistors coupled at the source to receive the inputs from the input stages. Alternatively, the circuit outputs may be coupled to sources of the output stage transistors, with the output stages transistors coupled at the drains to receive the inputs from the input stages.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A programmable logic cell comprising:
a grounded bent-gate transistor electrically isolating a cell input from a cell output stage.

2. The programmable logic cell of claim 1, further comprising:
the grounded bent-gate transistor forming an at least partially widened active region with a transistor of the cell output stage where the cell output stage receives an input from a cell input stage.

3. The programmable logic cell of claim 1, further comprising:
the grounded bent-gate transistor forming an at least partially widened active region with a transistor of a cell input stage where the cell input stage receives the cell input.

4. The programmable logic cell of claim 1, further comprising:
a first multiplexer and a second multiplexer, an input stage of the first multiplexer coupled to an input stage of the second multiplexer.

5. The programmable logic cell of claim 4, further comprising:
the first multiplexer and the second multiplexer each having bent-gate transistors joined to form an at least partially widened active region between the bent-gate transistors.

6. The programmable logic cell of claim 4, further comprising:
a third multiplexer and a fourth multiplexer sharing gate drives with input stages of the first and second multiplexers.

7. The programmable logic cell of claim 6, further comprising:
the third multiplexer and the fourth multiplexer each having bent-gate transistors joined to form an at least partially widened active region between the bent-gate transistors.

8. A circuit comprising:
at least one bent-gate grounded-gate transistor electrically isolating an output stage from a circuit input.

9. The circuit of claim 8, wherein the circuit is a multiplexer.

10. The circuit of claim 8, further comprising:
the at least one grounded-gate transistors coupled to at least partially widen an active region where a circuit input stage receives the circuit input, and to at least partially widen an active region where the output stage receives an input from the input stage.

11. The circuit of claim 10, further comprising:
the output stage comprising a bent-gate transistor where the output stage receives the input from the input stage.

12. The circuit of claim 8, further comprising:
at least one bent-gate grounded-gate transistor electrically isolating a second output stage from a second circuit input.

13. The circuit of claim 8, further comprising:
two input stages each comprising a pair of bent-gate transistors.

14. The circuit of claim 10, wherein the at least one grounded-gate transistors coupled to at least partially widen an active region where the output stage receives the input from the input stage further comprises:

the at least one grounded-gate transistor coupled to create an at least partially widened active region at a point where the output stage is coupled to an active region shared by two or more transistors of the circuit input stage.

* * * * *